US005386294A

United States Patent [19]

Ototake et al.

[11] Patent Number: 5,386,294

[45] Date of Patent: Jan. 31, 1995

[54] PATTERN POSITION MEASURING APPARATUS

[75] Inventors: Taro Ototake, Kamakura; Yasuko Maeda, Yokohama; Takakazu Ueki, Tokyo, all of Japan

[73] Assignee: Nikon Corporation, Tokyo, Japan

[21] Appl. No.: 210,768

[22] Filed: Mar. 21, 1994

Related U.S. Application Data

[63] Continuation of Ser. No. 723,428, Jun. 28, 1991, abandoned.

[30] Foreign Application Priority Data

Jul. 5, 1990 [JP] Japan .................................. 2-178229

[51] Int. Cl.[6] .............................................. G01B 11/00

[52] U.S. Cl. .................................................... 356/401

[58] Field of Search ................................ 356/399–401; 355/43, 53

[56] References Cited

U.S. PATENT DOCUMENTS

| | | | |
|---|---|---|---|
| 4,112,309 | 9/1978 | Nakazawa et al. | 250/560 |
| 4,730,927 | 3/1988 | Otatake et al. | 356/371 |
| 4,849,901 | 7/1989 | Shimizu | 356/400 |

FOREIGN PATENT DOCUMENTS

| | | |
|---|---|---|
| 57-44325 | 5/1979 | Japan . |
| 56-25964 | 6/1981 | Japan . |

*Primary Examiner*—Richard A. Rosenberger
*Assistant Examiner*—K. P. Hantis
*Attorney, Agent, or Firm*—Shapiro and Shapiro

[57] ABSTRACT

Position of a pattern of a sample placed on a stage is detected by detecting position of a pattern edge. Distortion of the whole sample surface is detected by measuring height of the sample, slope of the surface of the sample at a detected pattern edge position is calculated, and the detected position of the pattern edge is corrected in accordance with the calculated slope.

36 Claims, 3 Drawing Sheets

PATTERN POSITION MEASURING APPARATUS

This is a continuation of application Ser. No. 07/723,428 filed Jun. 28, 1991, now abandoned.

BACKGROUND OF THE INVENTION

1. Field of the Invention

The present invention relates to a pattern position measuring apparatus for measuring the position of a pattern formed on a sample such as a mask and a reticle.

2. Related Background

Hitherto, when the position of a pattern formed on the surface of a sample such as a mask and a reticle adsorbed onto the stage is detected, an error committed in the result of the measurement of the pattern due to the distortion of the sample is corrected.

For example, a pattern position measuring apparatus has been disclosed in U.S. Pat. No. 4,730,927 which is arranged in such a manner that, whenever an edge of a pattern formed on the surface of a sample is detected, the slope of the surface of the sample at this position is calculated so as to correct the position of the pattern edge.

However, the above-described conventional technology is arranged in such a manner that, whenever the pattern edge is measured, the measuring point and the interval between a position in front of the measuring point and a position in rear of the same are measured so as to obtain the slope of the sample at the measuring point and correct the distortion. Therefore, there arises a problem in that, if a large number of measuring points are measured, an excessively long time is required to complete the measurement, causing the throughput of the apparatus to deteriorate.

SUMMARY OF THE INVENTION

An object of the present invention is to provide a pattern position measuring apparatus and a pattern position detection method capable of improving the throughput of the apparatus.

According to one aspect of the present invention, there is provided a pattern position detection apparatus for obtaining the position of a pattern of a sample placed on a stage by detecting the pattern edge, the pattern position detection apparatus comprising: distortion detection means for detecting the distortion of the whole sample surface by measuring the height of the sample placed on the stage; slope calculating means for calculating, from the output from the distortion detection means, the slope of the surface of the sample at the position at which the pattern edge has been detected; and correction means for correcting the position of the pattern edge in accordance with the output from the slope detection means.

According to another aspect of the present invention, there is provided a method of detecting the pattern position for obtaining the position of a pattern of a sample placed on a stage by detecting the pattern edge, the method of detecting the pattern position comprising: a first step in which the distortion of the whole sample surface is detected by measuring the height of the sample placed on the stare; a second step in which the slope of the surface of the sample at which the pattern edge has been detected is calculated from the distortion; and a third step in which the position of the pattern edge is corrected in accordance with the slope thus-calculated.

The present invention is arranged in such a manner that the distortion of the whole sample surface is detected by the distortion detection means by measuring height of the sample at predetermined points distributed over two dimensions of the whole sample surface without regard to the position of the pattern edge. Therefore, the necessity of measuring the height of the surface of the sample in the vicinity of the edge position whenever the pattern edge is detected can be eliminated. Therefore, the number of the measuring operations required to detect the distortion can be significantly reduced in comparison to that required in the conventional structure.

According to the present invention, the distortion of the surface of the sample can be corrected. Furthermore, the necessity of performing the measurement for obtaining the distorted contour in the vicinity of each pattern position to be measured can be eliminated because the distorted contour has been previously obtained by detecting the height of the pattern plane (surface) at a plurality of positions of the sample. Therefore, even if a large number of points are measured, the deterioration of the throughput of the apparatus can be prevented satisfactorily.

Other and further objects, features and advantages of the invention will be appear more fully from the following description.

DESCRIPTION OF THE PREFERRED EMBODIMENTS

An embodiment of the present invention will now be described with reference to the drawings.

Figure 1:
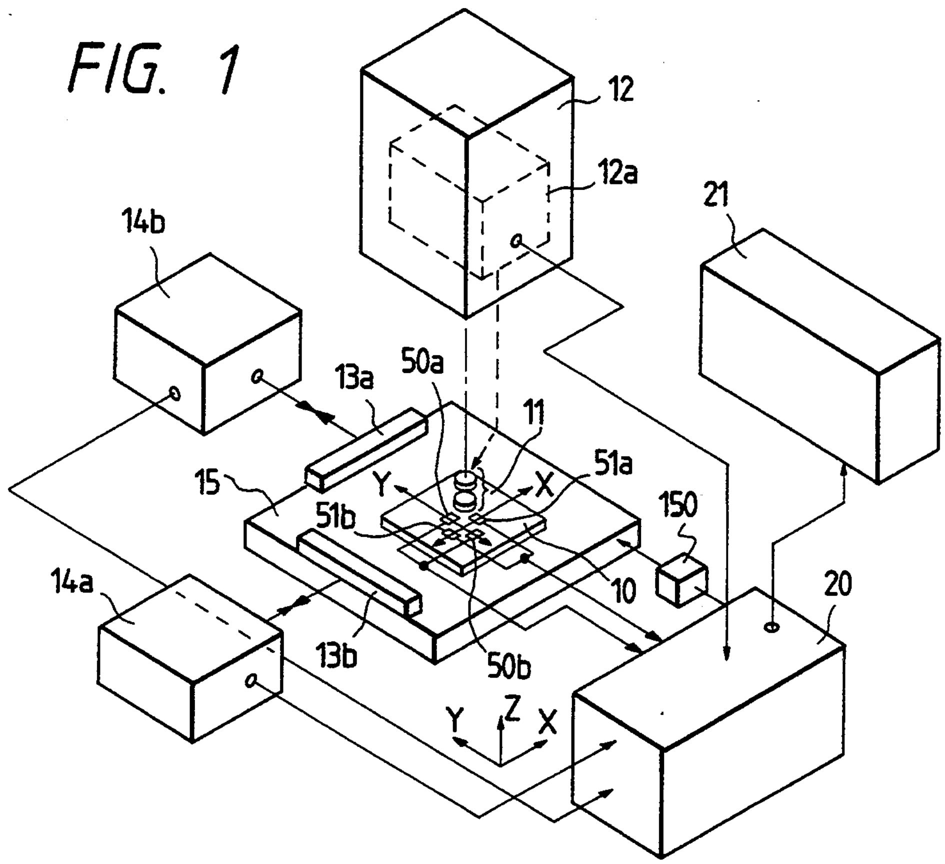
FIG. 1 is a perspective view which illustrates a pattern position measuring apparatus according to the present invention.
Figure 2:
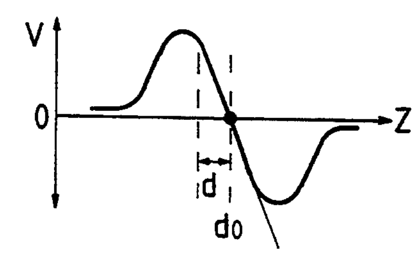
FIG. 2 illustrates the waveform of an S-curve signal obtainable by focal-point detection means.
Figure 6:
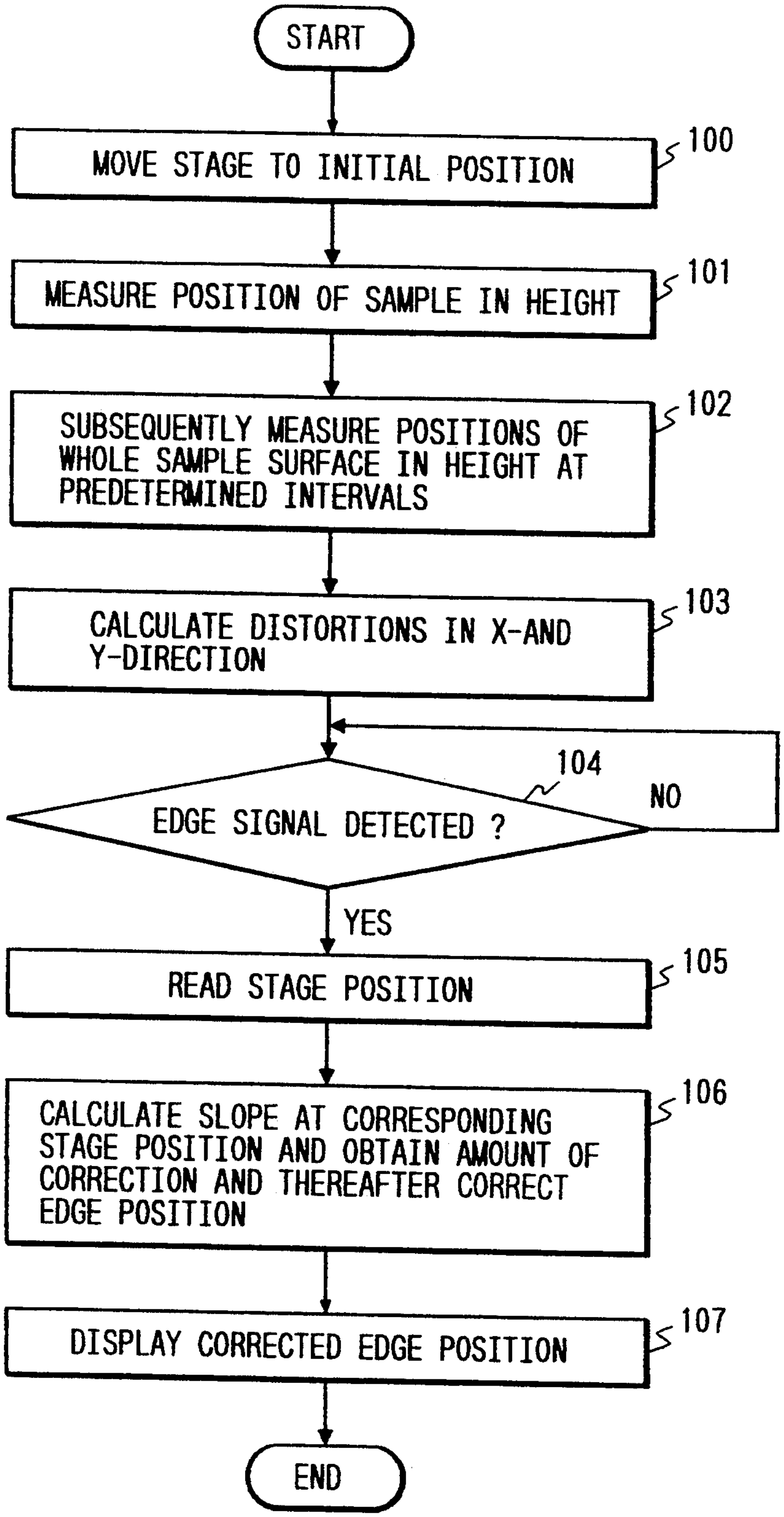
FIG. 6 is a flow chart about the operation performed by a main control unit 20 shown in FIG. 1.

FIG. 1 is a perspective view which illustrates a pattern position measuring apparatus according to the present invention. FIG. 6 is a flow chart showing the operation performed by a main control unit 20 shown in FIG. 1. A sample 10 such as a mask, a reticle or the like on which a predetermined original pattern has been formed is placed on an XY-stage 15. The pattern image is magnified by an objective lens 11 before it is imaged at a predetermined position in an optical unit 12. The optical unit 12 has a laser beam source disposed therein so as to irradiate the sample 10 with a laser soot via the objective lens 11. Since the pattern on a mask or a reticle usually has small edges in the form of pits and projections, scattered light or diffracted light is generated in the edge portion when it is relatively scanned by the spot light. Four light receiving elements 50*a*, 50*b*, 51*a* and 51*b* disposed to surround the objective lens 11 serve as an edge detection means for receiving the above-described scattered light or the like. Since the method of detecting the edge has been disclosed in Japanese Patent Publication No. 56-25962, its description has been omitted here. The optical unit 12 has a focal-point detection means 12*a* capable of automatically focusing by vertically moving the objective lens in direction Z. The focal-point detection means 12*a* is able to employ, for example, a means disclosed in Japanese Utility-Model Publication No. 57-44325. The focal-point detection means 12*a* is able to also detect the height of the surface of the sample 10. Now, the focus position detection operation performed by the focal-point detection means will now be briefly described. A laser beam emitted from the above-described laser light source is imaged on the surface of the sample 10 via the objective lens 11 to form a spot-shape (or a slit-shape). Light reflected from the sample 10 is again imaged by the objective lens 11. Furthermore, the position of a pin hole (or a slit) is simple-harmonic-oscillated in a direction of the optical axis (the direction z) relative to a predetermined focal plane. Furthermore, an output signal obtained by receiving light, which has passed through the pin hole (or the slit), is syncronously detected (synchronously commutated). As a result, an S-shape curve signal the voltage level of which with respect to the Z-directional position is, as shown in FIG. 2, changed, in the form of an S-shape can be obtained.

The S-curve signal thus obtained shows a linearity between the defocus quantity d and voltage level V in its small sections in front of the focus position $d_0$ and in rear of the same. Furthermore, it has characteristics which makes the voltage level V to be zero at the focus position $d_0$. Therefore, the Z-directional height of the sample 10 from the focus position $d_0$, that is, the interval between an ideal horizontal surface of the XY-stage 15, which two-dimensionally moves while carrying the sample 10 and which has been moved in this way, and the surface of the pattern formed on the sample 10 can be detected. As an alternative to using the magnitude of the S-curve signal to detect the interval, a structure may be employed in which focusing may be performed by actually vertically moving the objective lens 11 at each of the positions of the stage so that the height of the objective lens 11 at that time is detected. The XY-stage 15 which carries the sample 10 is two-dimensionally moved on an XY-plane (horizontal surface) by a drive unit 150 comprising a motor and the like. The XY-stage 15 is precisely manufactured so that an error with respect to the ideal horizontal surface of the XY-plane (horizontal surface) formed by the XY-stage 15 which has been moved as described above is satisfactorily small in comparison to the distortion of the sample 10.

The reflecting surface of each of movable mirrors 13*a* and 13*b* fixed to the end portions of the top surface of the XY stage 15 is irradiated with length measuring laser beams emitted from interferometer systems 14*a* and 14*b* for X-axis and Y-axis. As a result, the position of the XY-stage 15, that is, the XY-planar position (the coordinate value) of the surface of the sample 10 on the optical axis of the objective lens 11 can be detected. Then, a signal denoting the detected position is transmitted before it is received by a main control unit 20.

The main control unit 20 receives a signal transmitted from the focal-point detection means of the optical system 12 and corresponding to the state of focusing, signals denoting the position and transmitted from the X-axial and Y-axial interferometer systems and 14*b* and edge detection signals transmitted from the light receiving elements 50*a*, 50*b*, 51*a* and 51*b*. Then, the main control unit 20 supplies a control signal to the drive unit 50 and a display unit 21. The main control unit 20 possesses the following five functions.

The first function is a height detection function for detecting the height of the surface of the sample 10 in such a manner that the control signal is supplied to the drive unit 150 while monitoring the signals denoting the positions of the X-axis and the Y-axis and supplied from the X-axial interferometer system 14*a* and the Y-axial interferometer system 14b so that the stage 15 is two-dimensionally moved while stepping a predetermined interval. An output signal (output before the auto-focusing operation is commenced) from the focal-point detection means of the optical unit 12 is read at each of the stop positions of the stage 15. Thus, the Z-directional height of the surface of the sample 10 is detected from the distortion from the focus position $d_0$ (the voltage level is zero) so as to be stored together with the coordinate position (which corresponds to the position of the surface of the sample 10 on the optical axis of the objective lens 11) denoted by the position signals transmitted from the interferometer systems and 14*b*.

The second function is a distorted contour calculating function for compensating the predetermined interval (interval between measuring points) from the relationship between the position of the stage 15 obtained at predetermined intervals by the first function and the height of the surface of the sample 10, calculating the distorted contour of the surface of the sample 10 and storing the distorted contour together with the position of the stage.

The third function is a slope calculating function for calculating the slope of the surface of the sample 0 in accordance with the distorted contour of the whole sample surface calculated by the distorted contour calculating function when the edge signals are transmitted from the light receiving elements 50*a*, 51*a* and 51*b*.

The fourth function is a correcting function for correcting the edge position by a quantity which corresponds to the slope in accordance with the slope calculated by the slope calculating function, which is the third function, from the stage position signal when the edge signals are transmitted from the light receiving elements 50*a*, 50*b*, 51*a* and 51*b*. As a result, the coordinate of the edge of the surface of the sample 10 from which the distortion has been corrected is obtained.

The fifth function is a distance calculating function for reading the coordinate corrected by he correcting function and calculating the distance between the pattern edges from a plurality of coordinate values.

The operation of the pattern position measuring apparatus according to the embodiment shown in FIG. 1 will now be described with reference to a flow chart which illustrates the operation of the main control unit 20 shown in FIG. 6.

In response to the measurement start command supplied from an input device (omitted from illustration), the main control unit 20 issues drive commands to the drive unit 150 until the stage position signal becomes a signal denoting the initial position for the purpose of moving the XY-stage 5 to its initial position while monitoring the stage position signals transmitted from the X-axial interferometer system la and the Y-axial interferometer system 14*b* (step 100).

Figure 3:
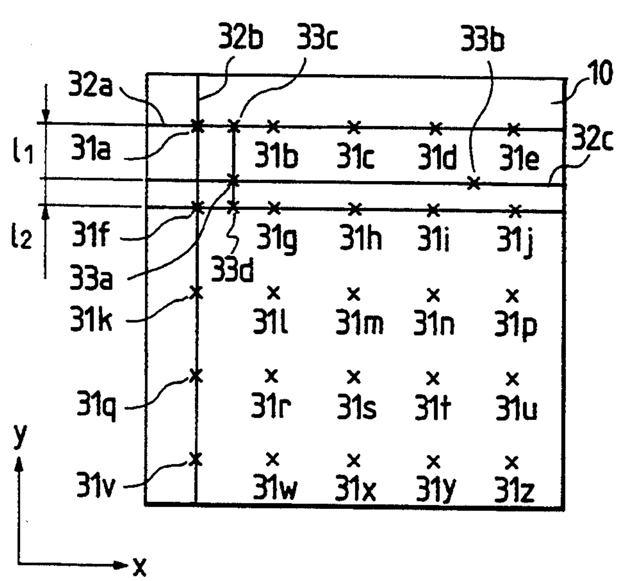
FIG. 3 illustrates the sequence of a process for obtaining the position, at which the distortion of the sample is measured, and the slope.

As a result, for example, a point 3*a* on the sample 10 shown in FIG. 3 is moved to a position on the optical axis of the objective lens 11 of the optical unit 12. The main control unit 20 measures height $H_{31a}$ of the surface of the sample 10 by reading the output voltage level at a moment before the auto-focusing function of the focal-point detection means of the optical unit 12 is operated so as to store it together with the stage position which corresponds to the point 31*a* (step 101).

The main control unit 20 sequentially stores heights $H_{31b}$ to $H_{31z}$ of the surface of the sample 10 at points 31*b* to 31*z* distributed over two dimensions at the whole surface of the sample 10 together with the stage position at each of the points (step 102). As shown in FIG. 6, this operation is performed before a pattern edge is detected in step 104 (later described) and thus is without regard to the position of the pattern edge.

Then, the main control unit 20 approximates the distorted contour on the line 32*a* in the direction X from the height of each of the points 31*a* to 31*e* arranged in the direction Z and data about the stage position, the main control unit 20 approximating as described above by using a quartic equation expressed as follows:

$$Z=a_zX^4+a_2X^2+a_4X+a_5.$$

Since the number of unknown constants a to as is five with respect to five data items of z and X, the abovedescribed quartic equation is univocally defined.

As described above, the quartic equations respectively expressing the distorted contour of X-directional points 31*f* to 31*j*, points 31*k* to 31*p*, 3*q* to 31*u* and 31*v* to 31*z* are obtained.

Furthermore, the deflected contour of points 31*a* to 31*v* arranged in the direction Y on line 32*b* in the direction Y is approximated by a quartic equation expressed as follows while making $b_1$, $b_2$, $b_3$, $b_4$ and $b_5$ to be constants:

$$z=b_1Y^4+b_2Y^3+b_4Y+b_5.$$

Similarly, quartic equations about the distorted contours of the Y-directional points 31*b* to 31*w*, 31*c* to 31*x*, 31*d* to 31*y* and 31*e* to 31*z* are sequentially obtained.

Figure 4:
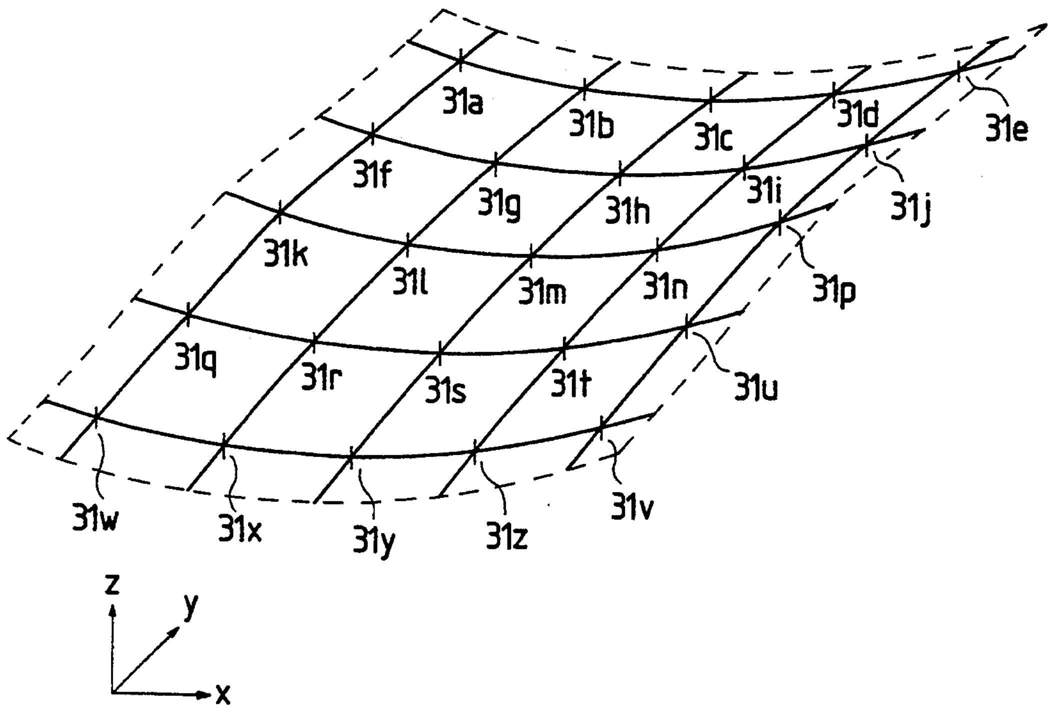
FIG. 4 illustrates an example of the distorted contour of the surface of the sample obtainable by means of approximation.

As a result, the deflected contour of the whole surface of the sample 10 can be obtained as shown in FIG. 4 (step 103).

Then, the main control unit 20 returns the stage 15 to its initial position before it controls the drive unit 150 so as to sequentially move the stage 15 from the above-described initial position so that the edge of the pattern is detected (step 104). From the outputs from the two interferometer systems 14*a* and 14*b* made when the edge signals are transmitted from the light receiving elements 50*a*, 50*b*, 51*a* and 51*b*, the position of the stage 15 when the edge signals are transmitted is read. Assuming that the edge signals are transmitted at a position 33*a* and a position 33*b* shown in FIG. 3, the position of the stage 15 which corresponds to the positions 33*a* and 33*b* is read so as to be stored (step 105).

The main control circuit 20 first stores an X-coordinate value which is the same as the X-coordinate value of the position 33*a* so as to obtain X-directional slopes $\theta_{x3}$ and $\theta_{x4}$ at the points 33*c* and 33*d* on the approximate expression adjacent to the position 33*a* among the quartic approximate expressions which have been obtained previously. The slopes $\theta_{x3}$ and $\theta_{x4}$ can be obtained by substituting the X-coordinate value obtainable by differentiating the previously-calculated quartic approximate expression.

In a case where the positional relationship between the position 33*a* of the pattern edge and the points 33*c* and 33*d* of the same is as shown in FIG. 3, the X-directional slope $\theta_{x1}$ at the position 33*a* can be calculated as follows by performing a proportional distribution:

$$\theta_{x1}=(l_2\eta_{x3}+l_1\theta_{x4})/(l_1+l_2).$$

In a case where a significantly high correction accuracy is not required, the X-directional slope $\theta_{x4}$ at the closer point 33*d* on the adjacent approximate equation may be employed as the slope $\theta_{x1}$ at the point 33*a*.

The X-directional slope $\theta_{x2}$ at the other point 33*b* of the pattern edge is similarly calculated.

Figure 5:
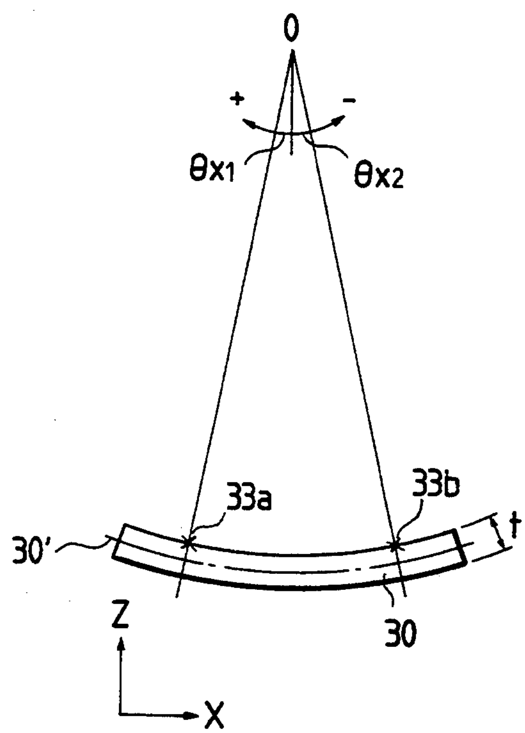
FIG. 5 illustrates an example of the distortion of the sample.

Furthermore, the Y-directional slopes $\theta_{y1}$ and $\theta_{y2}$ are similarly calculated. Then, the correction quantities $\frac{1}{2}t\theta_{x1}$, $\frac{1}{2}t\eta_{y1}$, $\frac{1}{2}t\theta_{x2}$, and $\frac{1}{2}t\theta_{y2}$ (where symbol t denotes the thickness of the sample 30) at positions 33*a* and 33*b* of the pattern edge are calculated so as to correct the coordinate value of the pattern edge detected by the interferometer systems 14*a* and 14*b* (step 106). In this state, an assumption is made that the deflected contour on the X-directional line 32*c*, on which the positions 33*a* and 33*b* of the pattern edge are positioned, is in the form of a circular arc around point 0 as shown in FIG. 5.

The quantity of correction can be directly obtained from the slope because the dimensional change in the sample due to the deformation of a neutral plane 30' can be neglected since the neutral plane 30' does not expand/contract. The distance between the positions B3*a* and 33*b* of the pattern edge includes an error of $\frac{1}{2}t(\theta_{x1}-\theta_{x2})$ in comparison to a case where the sample 10 is brought to a state of an ideal plane. However, the values of and $\theta_{x2}$ are plus values when the slope of the sample 10 rises rightward, while the same are minus values when the slope rises leftward. In this case, the measured distance between the positions 33*a* and 33*b* of the pattern edge becomes longer if the difference $\theta_{x1}-\theta_{x2}$ in the slope is a plus value, while the same becomes shorter if $\theta_{x1}-\theta_{x2}$ is a minus value. Since the error can be calculated from the difference between $\theta_{x1}$ and $\theta_{x2}$, the slope is cancelled even if the sample 10 is inclined with respect to the horizontal plane. The correction value of the Y-directional coordinate may be considered similarly.

The value of correction of the coordinate thus-obtained significantly approximates the coordinate value in a case where the surface of the sample 10 is not distorted.

Therefore, the main control unit 20 obtains the edge interval or the like from the coordinate value obtained by correcting the coordinate value obtained by the interferometers 1*a* and 1*b* when the edge signals of the light receiving elements 50*a*, 50*b*, 5*a* and 51*b* are generated, the edge interval or the like being displayed on the display unit 2 (step 107).

According to this embodiment, the intervals between the horizontal plane and the surface of the sample are detected at 25 points. However, the present invention is not limited to the above-described number of the detecting points. In a case where the approximated error of the distortion is desired to be reduced, the above-described number may be increased. In this case, the degree of the approximate expression must be raised. According to this embodiment, a relationship is held between degree m of the approximate expression and the number n of the height measuring points on one line, n being larger than m by one. However, an approximate expression of an arbitrary degree can be used in accordance with the least square method if a relationship $m<n-1$ is held. Furthermore, the number of the measuring points is not limited to $5\times5=25$ points. In addition, the approximate expression about the distortion is not limited to a high degree equation. An arbitrary equation can be used. Furthermore, a method of approximating the distortion may be employed which is performed in such a manner that the curved surface is approximated by a proper function expressed by $z=f(x, y)$. In this case, the necessity of using the proportional distribution employed according to the above-described embodiment can be eliminated regardless of the position of the pattern edge. The slope can be immediately obtained by differentiating the above-described function and by substituting the XY-coordinate values.

Although this embodiment is arranged in such a manner that the height of the surface of the sample 10 is detected in accordance with the signal transmitted from the focal-point detection means, the present invention is not limited to this. For example, a structure may be employed in which the amount of the vertical movement of the objective lens 11 is read by means such as an interferometer or a potentiometer. Furthermore, another structure may be employed which is arranged in such a manner that a Z-stage capable of vertically moving in direction Z is provided above the XY-stage 5 so that the amount of the Z-stage is read as an alternative to the amount of the vertical movement of the objective lens 11.

Furthermore, a photoelectric microscope for scanning the image of the pattern edge, which has been imaged by the objective lens 11, by using an oscillating slit or the like may, of course, be used as the edge detection means.

In addition, the present invention is not limited to the circular arc-like distortion of the sample to be measured according to this embodiment. The shape may, of course, be varied to correct the position of the pattern.

Although the invention has been described in its preferred form with a certain degree of particularly, it is understood that the present disclosure of the preferred form may be changed in the details of construction and the combination and arrangement of parts may be changed without departing from the spirit and the scope of the invention as hereinafter claimed.

What is claimed is:

1. A pattern position detection apparatus for obtaining the position of a pattern of a sample placed on a stage, by detecting the position of a pattern edge, said pattern position detection apparatus comprising:

distortion detection means for detecting distortion of substantially the whole sample surface by measuring height of the sample placed on said stage at points distributed over to dimensions of the whole sample surface before detection of a pattern edge position and without regard to the position of the pattern edge;

means for detecting the position of the pattern edge;

slope calculating means for calculating, from an output from said distortion detection means, slope of a sample surface at a detected position of the pattern edge; and correction means for correcting the detected position of the pattern edge in accordance with an output from said slope detection means.

2. A pattern position detection apparatus according to claim 1, wherein said distortion detection means includes:

moving means for moving said stage at predetermined intervals;

stage coordinate position detection means for detecting position of said stage;

height detection means for detecting height of the sample placed on said stage; and control means for obtaining the height detected by said height detection means corresponding to the position of said stage while monitoring a signal transmitted from said stage coordinate position detection means and while moving said stage by said moving means at said predetermined intervals.

3. A pattern position detection apparatus according to claim 2, wherein said height detection means detects height of the sample in response to a signal which corresponds to deviation from a focus position detected by a focal point detection means.

4. A pattern position detection apparatus according to claim 2, wherein said height detection means includes focal point detection means that detects height of the sample by detecting height of an objective lens or height of said stage.

5. A method of detecting pattern position by detecting the position of a pattern edge of a sample placed on a stage, comprising:

a first step in which distortion of substantially the whole sample surface is detected by measuring height of the sample placed on said stage;

a second step, after said first step is completed, in which a position of the pattern is detected;

a third step in which slope of a sample surface at a detected position of the pattern edge is calculated from the detected distortion; and a fourth step in which the detected position the pattern edge is corrected in accordance with the calculated slope.

6. A method of detecting pattern position according to claim 5, wherein said first step is performed in such a manner that the height is measured corresponding to position of said stage while moving said stage at predetermined intervals in accordance with positional information of said stage.

7. A method of detecting pattern position according to claim 23, wherein said first step is performed in such a manner that a distorted contour of a line in a direction X of the sample is approximated from height (z) and positional information (X) of five points in said direction X, by a quartic equation expressed as follows, in which $$z=a_1X_4+a_2X^3+a_3X^2+a_4X+a_5.$$

8. A method of detecting pattern position according to claim 7, wherein said third step is performed in such a manner that a slope of the sample surface at a detected pattern edge position is obtained by substituting X-directional coordinate values which have been obtained by differentiating said quartic equation.

9. A method of detecting pattern position according to claim 7, wherein said third step is performed in such a manner that a distorted contour of a line in a direction Y of said sample, which is perpendicular to said direction X, is approximated from height (z) and positional information (Y) of five points in said direction Y, by a quartic equation expressed as follows, in which $b_1$, $b_2$, $b_3$, $b_4$ and $b_5$ are constants:

$$z=b_1Y^4+b_2Y^2+b_4Y+b_5.$$

10. A method of detecting pattern position according to claim 9, wherein said third step is performed in such a manner that a slope of the sample surface at a detected pattern edge position is obtained by substituting Y-directional coordinate values which have been obtained by differentiating the last-recited quartic equation.

11. A method of detecting pattern position according to claim 5, wherein said first step is performed in such a manner that a distorted contour of a line in a direction X of the sample is approximated by an equation of an arbitrary degree m, which satisfies a relationship $m<n-1$, where n is an arbitrary number of sample height measuring points along said direction X, using the least square method.

12. A method of detecting pattern position according to claim 11, wherein said third step is performed in such a manner that a slope of the sample surface at a detected pattern edge position is obtained by substituting X-directional coordinate values which have been obtained by differentiating said equation.

13. A method of detecting pattern position according to claim 11, wherein said first step is performed in such a manner that a distorted contour of a line in a direction Y of said sample, which is perpendicular to said direction X, is approximated by an equation of an arbitrary degree m, which satisfies a relationship $m<n-1$, where n is an arbitrary number of sample height measuring points along said direction Y, using the least square method.

14. A method of detecting pattern position according to claim 13, wherein said third step is performed in such a manner that a slope of the sample surface at a detected pattern edge position is obtained by substituting Y-directional coordinate values which have been obtained by differentiating the last-recited equation.

15. A method of detecting pattern position according to claim 5, wherein said first step is performed in such a manner that a distorted contour of a line in a direction X of the sample and a line in a direction Y of the sample, which is perpendicular to the direction X, is approximated by an equation expressed by arbitrary function $z=f(x, y)$ relating to height (z) of an arbitrary number of sample height measuring points and positional information (x, y) of said stage.

16. A method of detecting pattern position according to claim 15, wherein said third step is performed in such a manner that a slope of the sample surface at a detected pattern edge position is obtained by substituting X and Y-directional coordinate values which have been obtained by differentiating said arbitrary function.

17. A method of detecting pattern position according to claim 5, wherein said first step is performed in such a manner that a distorted contour of the sample is approximated by an equation expressed by arbitrary function $z=f(x, y)$ relating to height (z) of an arbitrary number of sample height measuring points and positional information (x, y) of said stage.

18. A method of detecting pattern position according to claim 17, wherein said third step is performed in such a manner that a slope of the sample surface at a detected pattern edge position is obtained by substituting X and Y-directional coordinate values which have been obtained by differentiating said arbitrary function.

19. A pattern position detection apparatus for obtaining the position of a pattern of a sample placed on a stage, by detecting the position of a pattern edge, said pattern position detection apparatus comprising:

distortion detection means for detecting distortion of substantially the whole sample surface by measuring height of the sample placed on said stage at predetermined points distributed over two dimensions of the whole sample surface without regard to the position of the pattern edge;

means for detecting the position of the pattern edge;

slope calculating means for calculating, from an output from said distortion detection means, slope of a sample surface at a detected position of the pattern edge; and correction means for correcting the detected position of the pattern edge in accordance with an output from said slope detection means.

20. A pattern position detection apparatus according to claim 19, wherein said distortion detection means includes:

moving means for moving said stage at predetermined intervals;

stage coordinate position detection means for detecting position of said stage;

height detection means for detecting height of the sample placed on said stage; and control means for obtaining the height detected by said height detection means corresponding to the position of said stage while monitoring a signal transmitted from said stage coordinate position detection means and while moving said stage by said moving means at said predetermined intervals.

21. A pattern position detection apparatus according to claim 20, wherein said height detection means detects height of the sample in response to a signal which corresponds to deviation from a focus position detected by a focal point detection means.

22. A pattern position detection apparatus according to claim 20, wherein said height detection means includes focal point detection means that detects height of the sample by detecting height of an objective lens or height of said stage.

23. A method of detecting pattern position by detecting the position of a pattern edge of a sample placed on a stage, comprising:

detecting distortion of substantially the whole sample surface by measuring height of the sample placed on said stage at predetermined points distributed over two dimensions of the whole sample surface without regard to the position of the pattern edge;

detecting a position of the pattern edge;

calculating slope of a sample surface at a detected position of the pattern edge from the detected distortion; and correcting the detected position of the pattern edge in accordance with the calculated slope.

24. A method of detecting pattern position according to claim 23, wherein said detecting of distortion is performed in such a manner that the height is measured corresponding to position of said stage while moving said stage at predetermined intervals in accordance with positional information of said stage.

25. A method of detecting pattern position according to claim 23, wherein said detecting of distortion is performed in such a manner that a distorted contour of a line in a direction X of the sample is approximated from height (z) and positional information (X) of five points in said direction X, by a quartic equation expressed as follows, in which $a_1$, $a_2$, $a_3$, $a_4$, and $a_5$ are constants:

$$z=a_1X_4+a_2X^3+a_3X^2+a_4X+a_5.$$

26. A method of detecting pattern position according to claim 25, wherein said calculating is performed in such a manner that a slope of the sample surface at a detected pattern edge position is obtained by substituting X-directional coordinate values which have been obtained by differentiating said quartic equation.

27. A method of detecting pattern position according to claim 25, wherein said detecting of distortion is performed in such a manner that a distorted contour of a line in a direction Y of said sample, which is perpendicular to said direction X, is approximated from height (z) and positional information (Y) of five points in said direction Y, by a quartic equation expressed as follows, in which $b_1$, $b_2$, $b_3$, $b_4$ and $b_5$ are constants:

$$z=b_1Y^4+b_2Y^3+b_4Y+b_5.$$

28. A method of detecting pattern position according to claim 27, wherein said calculating is performed in such a manner that a slope of the sample surface at a detected pattern edge position is obtained by substituting Y-directional coordinate values which have been obtained by differentiating the last-recited quartic equation.

29. A method of detecting pattern position according to claim 23, wherein said detecting of distortion is performed in such a manner that a distorted contour of a line in a direction X of the sample is approximated by an equation of an arbitrary degree m, which satisfies a relationship $m<n-1$, where n is an arbitrary number of sample height measuring points along said direction X, using the least square method.

30. A method of detecting pattern position according to claim 29, wherein said calculating is performed in such a manner that a slope of the sample surface at a detected pattern edge position is obtained by substituting X-directional coordinate values which have been obtained by differentiating said equation.

31. A method of detecting pattern position according to claim 29, wherein said detecting of distortion is performed in such a manner that a distorted contour of a line in a direction Y of said sample, which is perpendicular to said direction X, is approximated by an equation of an arbitrary degree m, which satisfies a relationship $m<n-1$, where n is an arbitrary number of sample height measuring points along said direction Y, using the least square method.

32. A method of detecting pattern position according to claim 31, wherein said calculating is performed in such a manner that a slope of the sample surface at a detected pattern edge position is obtained by substituting Y-directional coordinate values which have been obtained by differentiating the last-recited equation.

33. A method of detecting pattern position according to claim 23, wherein said detecting of distortion is performed in such a manner that a distorted contour of a line in a direction X of the sample and a line in a direction Y of the sample, which is perpendicular to the direction X, is approximated by an equation expressed by arbitrary function $z=f(x, y)$ relating to height (z) of an arbitrary number of sample height measuring points and positional information (x, y) of said stage.

34. A method of detecting pattern position according to claim 33, wherein said calculating is performed in such a manner that a slope of the sample surface at a detected pattern edge position is obtained by substituting X and Y-directional coordinate values which have been obtained by differentiating said arbitrary function.

35. A method of detecting pattern position according to claim 23, wherein said detecting of distortion is performed in such a manner that a distorted contour of the sample is approximated by an equation expressed by arbitrary function $z=f(x, y)$ relating to height (z) of an arbitrary number of sample height measuring points and positional information (x, y) of said stage.

36. A method of detecting pattern position according to claim 35, wherein said calculating is performed in such a manner that a slope of the sample surface at a detected pattern edge position is obtained by substituting X and Y-directional coordinate values which have been obtained by differentiating said arbitrary function.

* * * * *